United States Patent
Kadowaki et al.

(10) Patent No.: US 7,675,954 B2
(45) Date of Patent: Mar. 9, 2010

(54) SEMICONDUCTOR LASER DEVICE

(75) Inventors: Tomoko Kadowaki, Tokyo (JP); Tohru Takiguchi, Tokyo (JP); Toshio Tanaka, Tokyo (JP); Yutaka Mihashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 222 days.

(21) Appl. No.: 11/144,772

(22) Filed: Jun. 6, 2005

(65) Prior Publication Data
US 2006/0018358 A1 Jan. 26, 2006

(30) Foreign Application Priority Data
Jul. 21, 2004 (JP) ............... 2004-212508

(51) Int. Cl.
*H01S 5/00* (2006.01)
*H01S 5/02* (2006.01)
(52) U.S. Cl. .................... 372/43.01; 372/38.05; 372/87
(58) Field of Classification Search .............. 372/38.05, 372/87, 81, 43.01
See application file for complete search history.

(56) References Cited

U.S. PATENT DOCUMENTS

| | | | | |
|---|---|---|---|---|
| 5,683,937 A | * | 11/1997 | Furukawa et al. | 438/42 |
| 5,880,487 A | * | 3/1999 | Furukawa et al. | 257/99 |
| 5,881,087 A | * | 3/1999 | Sukhman et al. | 372/61 |
| 6,323,507 B1 | * | 11/2001 | Yokoyama et al. | 257/79 |
| 6,455,338 B1 | * | 9/2002 | Takagi et al. | 438/24 |
| 6,459,712 B2 | * | 10/2002 | Tanaka et al. | 372/45.01 |
| 6,512,248 B1 | * | 1/2003 | Takeuchi et al. | 257/81 |
| 6,751,242 B2 | * | 6/2004 | Kaneko et al. | 372/43.01 |
| 6,765,944 B2 | * | 7/2004 | Yagi et al. | 372/46.01 |
| 6,778,572 B1 | * | 8/2004 | Ohsaka et al. | 372/43.01 |
| 6,858,944 B2 | * | 2/2005 | Huang et al. | 257/786 |
| 6,965,623 B2 | * | 11/2005 | Fujiyoshi et al. | 372/38.05 |
| 2003/0067072 A1 | * | 4/2003 | Ono et al. | 257/737 |
| 2003/0165169 A1 | * | 9/2003 | Nomoto et al. | 372/46 |
| 2004/0070351 A1 | * | 4/2004 | Roach | 315/224 |
| 2004/0214429 A1 | * | 10/2004 | Han et al. | 438/642 |
| 2004/0218646 A1 | * | 11/2004 | Mihashi et al. | 372/46 |
| 2004/0240503 A1 | * | 12/2004 | Fukai et al. | 372/46 |
| 2005/0195876 A1 | * | 9/2005 | Sato et al. | 372/43.01 |

FOREIGN PATENT DOCUMENTS

JP 2002-280663 9/2002

* cited by examiner

*Primary Examiner*—Minsun Harvey
*Assistant Examiner*—Michael Carter
(74) *Attorney, Agent, or Firm*—Leydig, Voit & Mayer, Ltd.

(57) ABSTRACT

A semiconductor laser device includes: an electrically insulating film on the top face of a laser chip; and a metal film, on the electrically insulating film. The electrically insulating film and/or the metal film has, in plan, a polygonal shape with five or more apexes, each of the apexes having an interior angle less than 180 degrees. Stress due to a change of temperature during operation is reduced, resulting in a semiconductor laser device having a longer life and higher reliability.

2 Claims, 9 Drawing Sheets

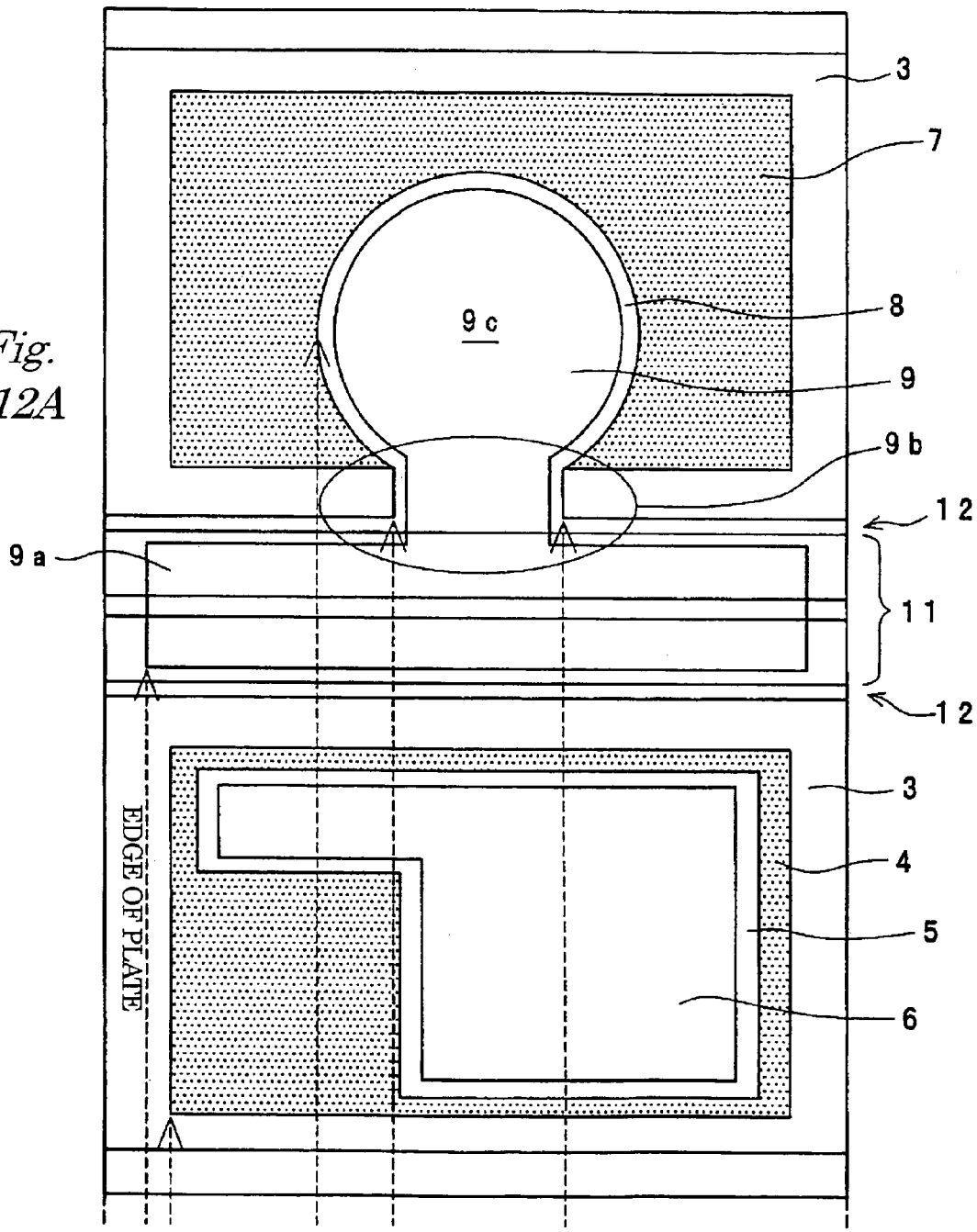
Fig. 12A  *PRIOR ART*
Fig. 12B
FRONT  EDGE OF UNDERLAY   EDGE OF PAD   EDGE OF PAD   REAR

SEMICONDUCTOR LASER DEVICE

BACKGROUND OF THE INVENTION

1. Field of the Invention

The present invention relates to a semiconductor laser device, and more particularly to a semiconductor laser device with an ingenious patterning of an electrical insulating film or a metal film formed on the top face of a semiconductor chip.

2. Description of the Related Art

An AlGaInAs/InP-based laser, which exhibits good thermal and high-frequency characteristics, has been spotlighted as a semiconductor laser for optical fiber communications. Another AlGaInP/GaAs-based laser, which exhibits good thermal characteristics and excellent high-power operation, has been also spotlighted as a semiconductor laser for information processing. Most of these semiconductor lasers employ a ridge waveguide type structure, which can reduce processing steps and costs for manufacturing them.

In such ridge waveguide type semiconductor lasers, stress due to patterning of an electrical insulating film or an electrode formed on the surface of the chip are considered for one of degradation factors during energizing.

The related prior art is listed as follows: Japanese Patent Unexamined Publications (kokai) JP-A-2002-280663.

FIG. 10 is a plan view showing a conventional AlGaInAs/InP-based semiconductor laser device of ridge waveguide type. FIG. 11 is a perspective view showing the laser device in FIG. 10.

On the top face of a laser chip 1 formed are two grooves 12 by etching, and between these grooves 12 formed is a narrow ridge portion 11. On both sides of the grooves 12 formed are two stage portions 13 and 14, respectively.

The top face of the laser chip is covered with an electrical insulating film 3, such as $SiO_2$, except the vicinity of the summit of the ridge portion 11, on which a stripe-like opening is provided. On the upper faces of the stage portions 13 and 14 formed are underlaid films 4 and 7, such as $SiO_2$. On the underlaid film 4 of the stage portion 13 formed is a deposited electrodes, and on the deposited electrode 5 a plated electrode 6 is formed. Meanwhile, another deposited electrode 8 is formed so as to extend from the underlaid film 7 of the stage portion 14 via the groove 12 to the summit of the ridge portion 11, and on the deposited electrode 8 a plated electrode 9 is formed. Both the deposited electrode 8 and the plated electrode 9 have a chip contact portion 9a on the upper face of the ridge portion 11, a lead-out portion 9b in the groove, and a bonding pad 9c on the upper face of the stage portion 14.

Next, problems on the conventional semiconductor laser device of ridge waveguide type will be described below. After continuously energizing the semiconductor laser device for a long time, the device is gradually degraded, finally laser oscillation will be stopped. For one approach for analyzing degradation factors of such a device, bottom face EL (electroluminescence) evaluation is known. The bottom face EL evaluation is a method of observing light-emitting conditions of a laser device from the bottom face of the chip. In case crystalline defects occur in the chip during energizing, dark spots or lines can be observed, thereby effectively detecting degraded locations or degradation factors in the waveguide.

FIGS. 12A and 12B are explanatory views illustrating a relation between a pattern on the surface of the chip and an EL pattern on the bottom face. The EL pattern on the bottom face, as shown in FIG. 12B, is a macrophotograph which is taken by picturizing a light-emitting pattern of a degraded device from the bottom face of the chip, after continuously energizing it, e.g., for several hundred hours with a current of one hundred and several dozen mA at a temperature of 85 degree-C.

As seen in detail from the EL pattern on the bottom face, typical dark spots occur (1) at a location corresponding to a front edge of the chip-contact portion 9a of the plated electrode 9, (2) at a location corresponding to front edges of the underlaid films 4 and 7, and (3) at locations corresponding to the lead-out portion 9b of the deposited electrode 8 and the plated electrode 9, and a front edge of the bonding pad 9c, respectively. Each of these front edges and each of the locations in which the dark spots occur commonly reside on a straight line perpendicular to the longitudinal direction of the ridge portion 11.

Firstly, a main degradation factor in item (1) will be discussed below. Thickness of the plated electrode 9 is typically about 4 µm, whereas thickness of the deposited electrode 8 is typically about 0.8 µm, thereby causing a higher current density in the vicinity of the edge of the plated electrode inside the deposited electrode. The current concentration on the vicinity of the edge of the plated electrode causes a localized rise of temperature, so that crystalline defects occur inside an active layer right under the edge of the plated electrode. This is one of degradation factors.

Secondly, main degradation factors in items (2) and (3) will be discussed below. As referring to FIG. 10, the underlaid films 4 and 7, the deposited electrodes 5 and 8, and the plated electrodes 6 and 9, which are formed on the surface of the chip, have linear portions W1, W2, W3, W4 and W5, perpendicular to the ridge portion 11. When the ridge portion 11 is supplied with a current, the temperature of the whole chip rises up, not only in the ridge portion 11 where the current passes through, but also in an area where no current flows. The rise of temperature of the chip causes stress, since a crystal constituting the laser chip, a material of the underlaid films and a material of the electrodes have different coefficients of thermal expansion. In case the ridge portion 11 undergoes such stress from the linear portions perpendicular to the ridge portion 11, crystalline defects occur inside an active layer right under the ridge portion 11, thereby causing dark spots in the bottom face EL pattern, as shown in FIG. 12B. In particular, the lead-out portions of the deposited electrode 8 and the plated electrode 9 is located closely to the ridge portion 11, causing larger stress.

Further, as to another degradation factor of item (1), in addition to the above-mentioned current concentration in the vicinity of the edge of the plated electrode, the linear portion w6 of the edge of the plated electrode intersects perpendicularly to the ridge portion 11, thereby causing stress due to the difference in coefficient of thermal expansion between the metal constituting the electrode and the crystal. This may be one of degradation factors.

As described above, in the conventional semiconductor laser device of ridge waveguide type, because of stress due to the differences in coefficient of thermal expansion among the electrical insulating film and the electrodes, which are formed on the surface of the chip, and the crystal, crystalline defects occur during energizing, thereby presumably causing the device to be degraded.

SUMMARY OF THE INVENTION

An object of the present invention is to provide a semiconductor laser device having a longer life and higher reliability by reducing stress due to a change of temperature during energizing.

A semiconductor laser device according to the present invention, includes:

an electrical insulating film, provided on the top face of a laser chip; and a metal film, provided on the electrical insulating film;

wherein the electrical insulating film and/or the metal film have a planar shape of polygon with five or more apexes, each of apexes having an interior angle less than 180 degree.

In the semiconductor laser device, the edge line of the electrical insulating film and/or the metal film preferably include a curve.

A semiconductor laser device according to the present invention, includes a semiconductor chip and a metal electrode;

the chip including:

an active layer;

a first semiconductor layer provided on the upper side of the active layer;

a second semiconductor layer provided on the lower side of the active layer;

two grooves parallel to each other, formed by etching the first semiconductor layer;

a ridge portion having a waveguide function, provided between the grooves; and a stage portion provided on the lateral side of the grooves, the metal electrode including:

a chip contact portion provided on the top face of the ridge portion;

a lead-out portion provided in one of the grooves; and a bonding pad provided on the top face of the stage portion;

wherein the edge line of the chip contact portion intersects obliquely with the edge line of the lead-out portion.

In the semiconductor laser device, the edge line of the lead-out portion preferably includes a curve.

A semiconductor laser device according to the present invention, includes a semiconductor chip and a metal electrode;

the chip including:

an active layer;

a first semiconductor layer provided on the upper side of the active layer;

a second semiconductor layer provided on the lower side of the active layer;

two grooves parallel to each other, formed by etching the first semiconductor layer;

a ridge portion having a waveguide function, provided between the grooves; and a stage portion provided on the lateral side of the grooves, the metal electrode including:

a chip contact portion provided on the top face of the ridge portion;

a lead-out portion provided in one of the grooves; and a bonding pad provided on the top face of the stage portion;

wherein the edge line of the chip contact portion is curved in the vicinity of the end face of the ridge portion.

In the semiconductor laser device, preferably further includes:

an electrical insulating film being provided on the top face of the stage portion;

wherein a first line which is perpendicular to the longitudinal direction of the ridge portion and in contact with the edge of the electrical insulating film, and a second line which is perpendicular to the longitudinal direction of the ridge portion and in contact with the edge of the lead-out portion of the metal electrode, do not reside on the same straight line.

In the semiconductor laser device, it is preferable that a first electrical insulating film is provided on the top face of the stage portion located on the left side of the grooves, and a second electrical insulating film is provided on the top face of the stage portion located on the right side of the grooves, and a third line which is perpendicular to the longitudinal direction of the ridge portion and in contact with the edge of the first electrical insulating film, and a fourth line which is perpendicular to the longitudinal direction of the ridge portion and in contact with the edge of the second electrical insulating film, do not reside on the same straight line.

In the semiconductor laser device, the bonding pad is preferably located closer to the end face, having a lower optical concentration, with respect to the center of the ridge portion.

According to the present invention, by employing such an ingenious shape of the electrical insulating film and/or the metal film formed on the top face of the chip, stress onto a light emitting region can be reduced, thereby realizing a semiconductor laser device having a longer life and higher reliability.

BRIEF DESCRIPTION OF THE DRAWINGS

FIGS. 12A and 12B are explanatory views illustrating a relation between a pattern on the surface of a chip and an EL pattern on the bottom face.

DETAILED DESCRIPTION OF THE PREFERRED EMBODIMENTS

This application is based on an application No. 2004-212508 filed on Jul. 21, 2004 in Japan, the disclosure of which is incorporated herein by reference.

Hereinafter, preferred embodiments will be described with reference to drawings.

Embodiment 1

Figure 1:
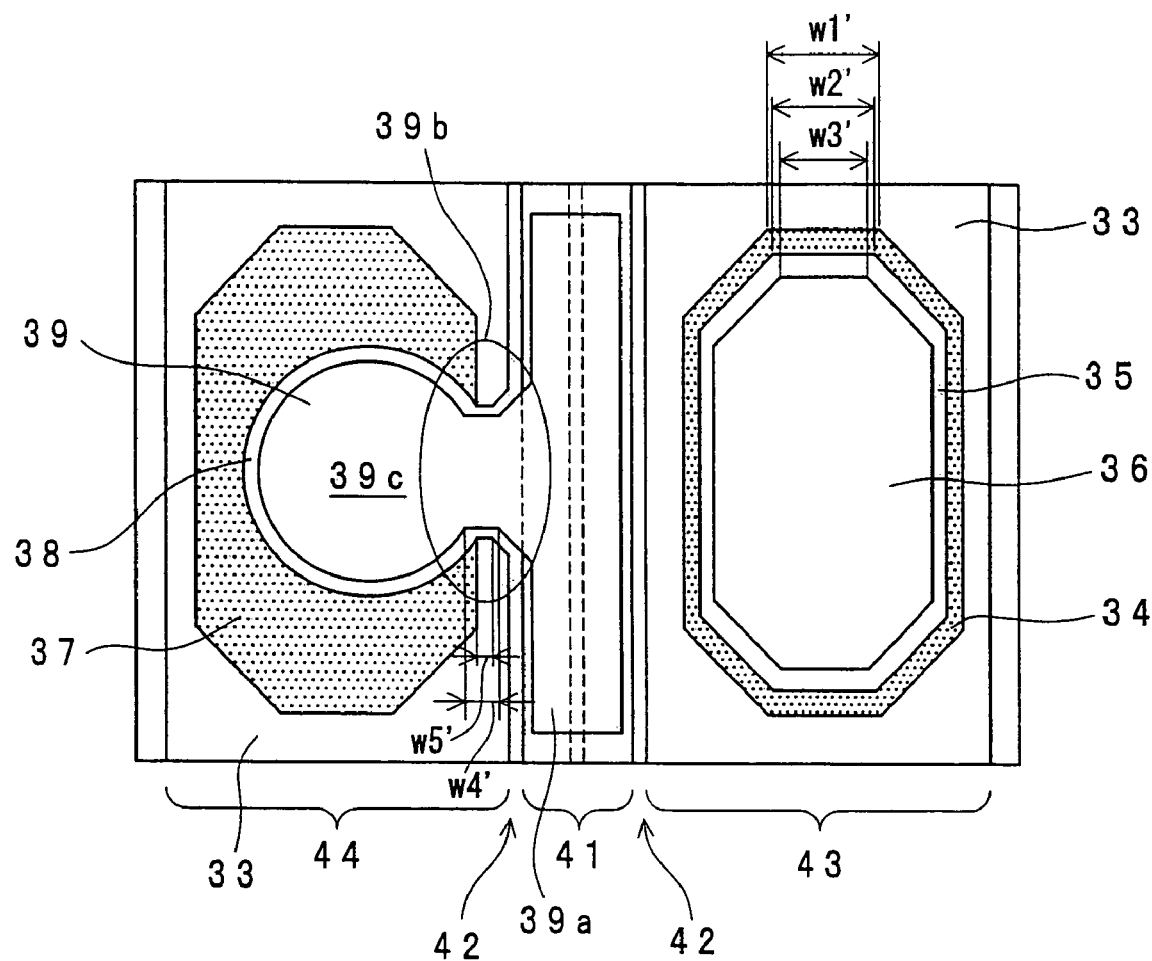
FIG. 1 is a plan view showing the first embodiment of the present invention.
Figure 2:
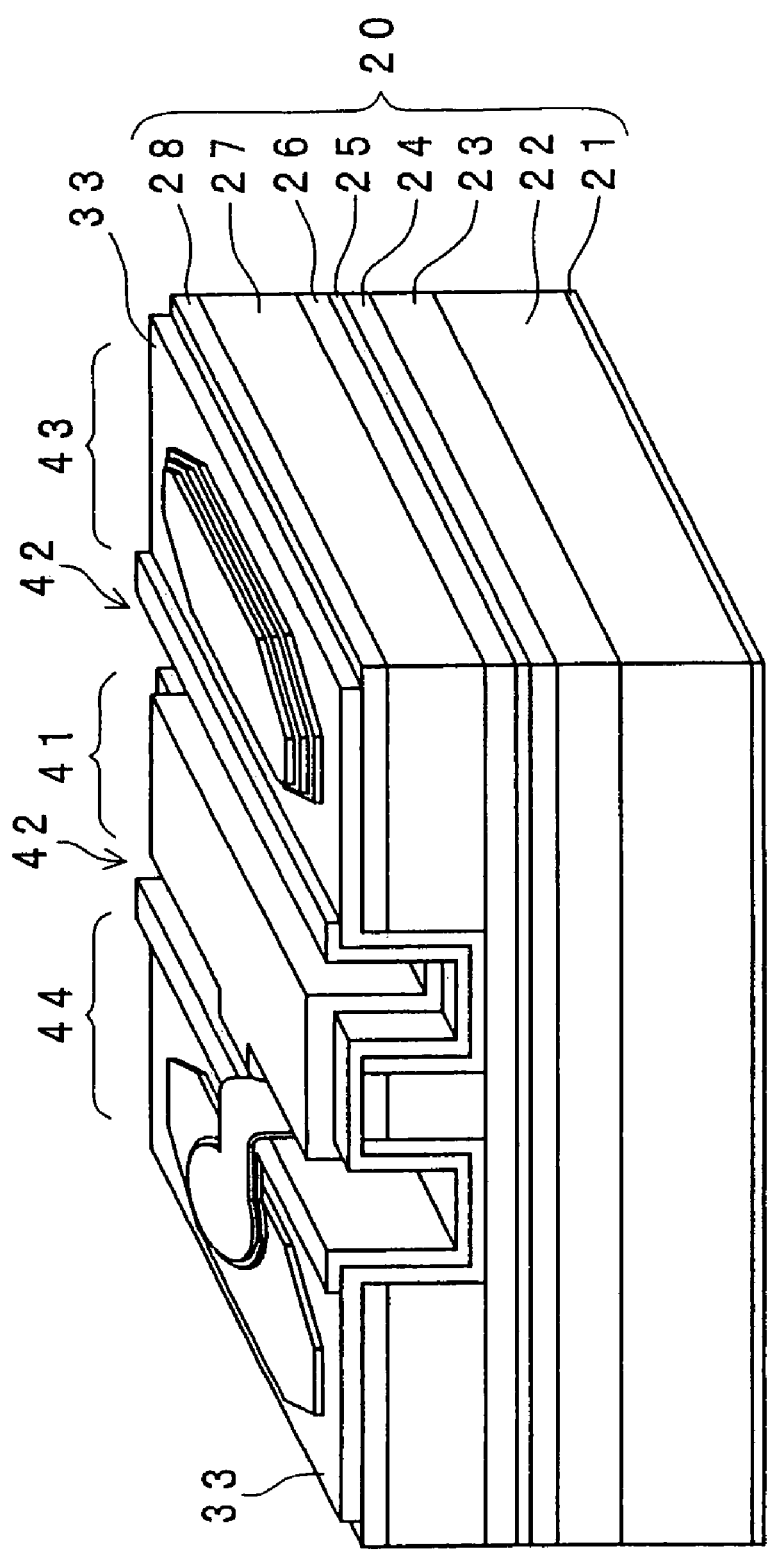
FIG. 2 is a perspective view showing the first embodiment of the present invention.

FIG. 1 is a plan view showing the first embodiment of the present invention, and FIG. 2 is a perspective view thereof. Here exemplified is a semiconductor laser device of ridge waveguide type. As shown in FIG. 2, on a substrate 22 of n-InP epitaxially grown are a cladding layer 23 of n-InP (e.g., thickness of 1 µm), a cladding layer 24 of n-AlInAs (e.g., thickness of 0.1 µm), an MQW (Multi-Quantum-Well) active layer 25 of AlGaInAs, a cladding layer 26 of p-AlInAs (e.g., thickness of 0.1 μm), a cladding layer 27 of p-InP (e.g., thickness of 1.75 μm), and a contact layer 28 of p-InGaAs (e.g., thickness of 0.6 μm), in this sequence using MOCVD (metalorganic chemical vapor deposition) to constitute a laser chip 20. An n-side electrode 21 is formed on the bottom face of the substrate 22.

On the top face of the laser chip 20, two grooves 42 are formed using etching, such as dry or wet etching, and between these grooves 42 formed is a ridge portion 11, e.g., with a width of 1.8 μm. On both sides of the grooves 42 formed are two stage portions 43 and 44, respectively.

The top face of the laser chip 20 is covered with an electrical insulating film 33 (e.g., thickness of 0.2 μm), such as $SiO_2$, except the vicinity of the summit of the ridge portion 41. On the summit of the ridge portion 41 a stripe-like opening is provided. The laser chip 20 is supplied via the opening with a current to enhance current concentration in a light emitting region of the active layer 25.

On the upper faces of the stage portions 43 and 44 formed are underlaid films 34 and 37, such as $SiO_2$, respectively. On the underlaid film 34 of the stage portion 43 formed is a deposited electrode 35, and on the deposited electrode 35 a plated electrode 36 is formed.

Meanwhile, another deposited electrode 38 is formed so as to extend from the underlaid film 37 of the stage portion 44 via the groove 42 to the summit of the ridge portion 41, and on the deposited electrode 38 a plated electrode 39 is formed. Both the deposited electrode 38 and the plated electrode 39 have a chip contact portion 39a on the upper face of the ridge portion 41, a lead-out portion 39b in the groove, and a bonding pad 39c on the upper face of the stage portion 44.

The deposited electrodes 35 and 38 are formed of a metal multilayered film, such as Ti/Au or Ti/Pt/Au, using vapor deposition or sputtering, typically with a thickness of about 0.8 μm.

The plated electrodes 36 and 39 are formed of a metal material, such as Au, using electrolytic plating, typically with a thickness of about 4 μm. These plated electrodes 36 and 39 function as (1) to improve heat dissipation of the laser chip 20, and (2) to improve press-adhesion when wire-bonding an Au-wire onto the bonding pad 39c.

The underlaid film 34 and 37, typically having a thickness of about 0.4 μm, are provided to reduce capacitance between the laser chip 20 and the electrodes 38 and 39.

Next, the laser operation will be described below. When a positive voltage is applied to a bonding wire with the n-side electrode 21 connected to a ground line, a current passes from the boding pad 39c through the lead-out portion 39b and the chip contact portion 39a via the opening on the summit of the ridge portion into the contact layer 28 inside the ridge portion 41, and then flows in the sequence of the cladding layer 27, the cladding layer 26, the active layer 25, the cladding layer 24, the cladding layer 23 and the substrate 22. In the active layer 25, an electron density and a hole density right under the ridge portion 41 are increased. The current exceeding a threshold enables stimulated emission to start. Laser oscillation occurs by optical resonance between both the end faces of the laser chip 20.

Incidentally, the underlaid film 34, the deposited electrode 35 and the plated electrode 36 on the right stage portion 43 are not involve with the electric operation of the laser device. But the increased height of the plated electrode 36 coincides with the height of the left plated electrode 39. This structure can prevent the chip from tilting obliquely during suctioning the top face thereof using a vacuum chuck at a subsequent step for die-bonding the chip.

In this embodiment, the underlaid film 34, the deposited electrode 35 and the plated electrode 36 on the right stage portion 43 have a planar shape of polygon with five or more apexes, each of apexes having an interior angle less than 180 degree. Similarly, the underlaid film 37 on the left stage portion 44 has also a planar shape of polygon with five or more apexes, each of apexes having an interior angle less than 180 degree.

Figure 10:
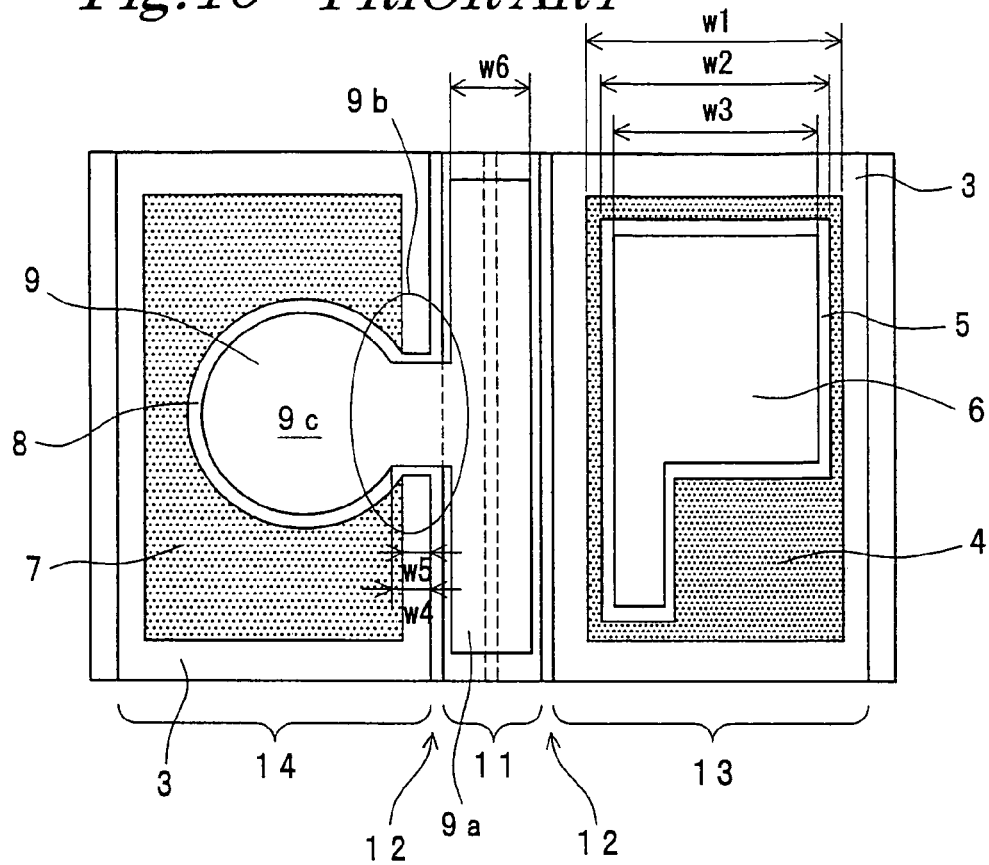
FIG. 10 is a plan view showing a conventional AlGaInAs/InP-based semiconductor laser device of ridge waveguide type.
Figure 11:
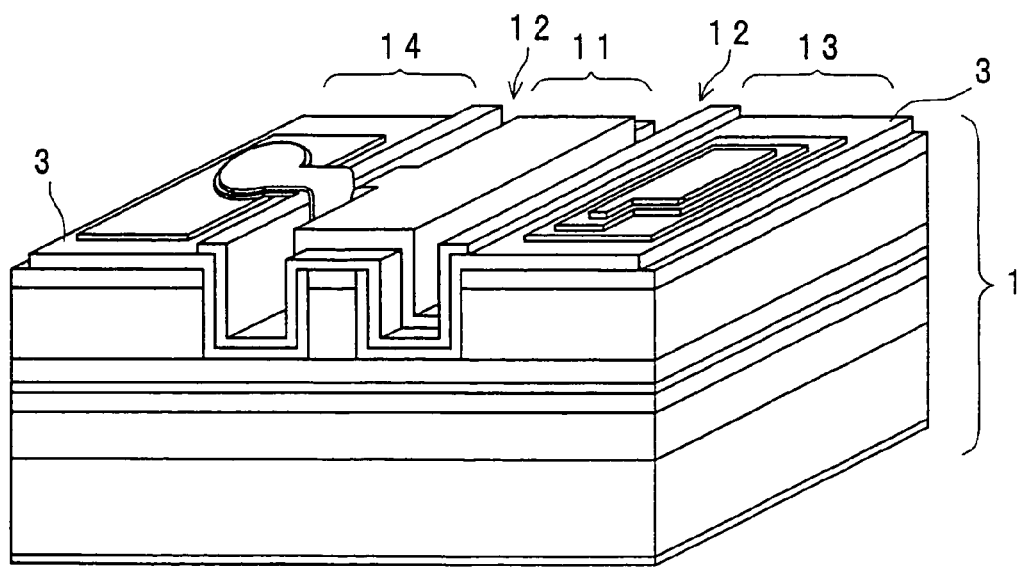
FIG. 11 is a perspective view showing the laser device in FIG. 10.

In case the underlaid film 34, the deposited electrode 35 and the plated electrode 36 have a planar shape of, for example, octagon as shown in FIG. 1, each length of the straight line w1, w2 and w3, which are perpendicular to the ridge portion 41, is decreased into each length of the straight line w1', w2' and w3', respectively, in comparison with the conventional planar shape shown in FIG. 10. Similarly, in case the left underlaid film 37 has a planar shape of octagon as shown in FIG. 1, length of the straight line perpendicular to the ridge portion 41 is decreased in comparison with the conventional planar shape. This polygonal planar shape can reduce the influence of stress due to thermal expansion on the ridge portion 41 during rising of temperature of the chip. Consequently, a semiconductor laser device having a longer life and higher reliability can be realized.

Further, in this embodiment, each lead-out portion 39b of the deposited electrode 38 and the plated electrode 39 is shaped so that the edge line of the chip contact portion 39a intersects obliquely with the edge line of the lead-out portion 39b. In case, as shown in FIG. 1, the edge line of the lead-out portion 39b intersects at about 45 degree, for example, with the edge line of the chip contact portion 39a, each length of the straight line w4 and w5, which are perpendicular to the ridge portion 41, is decreased into each length of the straight line w4' and w5', respectively, in comparison with the conventional planar shape shown in FIG. 10. This shape can reduce the influence of stress due to thermal expansion on the ridge portion 41 during rising of temperature of the chip. Consequently, a semiconductor laser device having a longer life and higher reliability can be realized.

Embodiment 2

Figure 3:
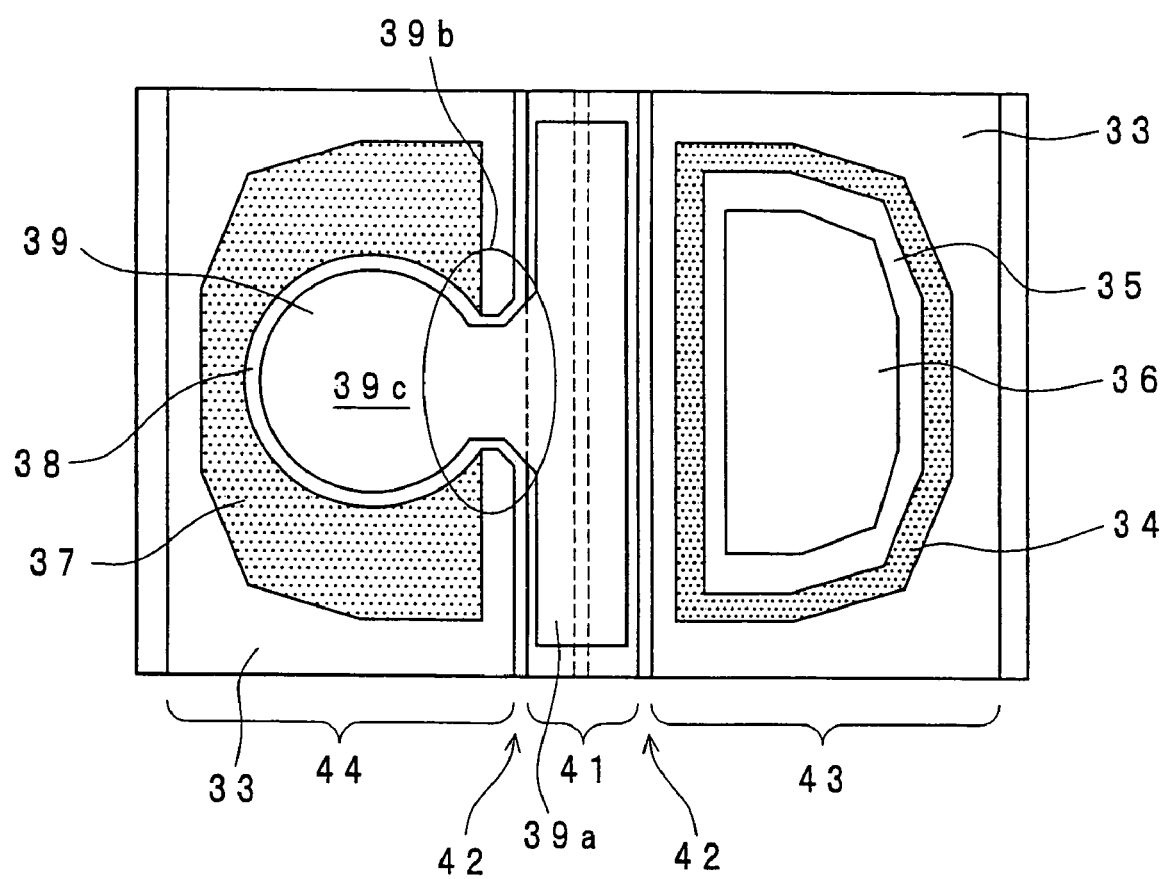
FIG. 3 is a plan view showing the second embodiment of the present invention.

FIG. 3 is a plan view showing the second embodiment of the present invention. In this embodiment, a semiconductor laser device has the same structure as shown in FIG. 2, but the underlaid film 34, the deposited electrode 35 and the plated electrode 36 on the right stage portion 43, and the underlaid film 37 on the left stage portion 44 have a planar shape of different polygon.

Specifically, as shown in FIG. 3, a straight line close and parallel to the ridge portion 41 is kept as the conventional shape, whereas the remaining contours constitute an octagon including a number of straight lines. This polygonal planar shape can decrease such a straight component perpendicular to the ridge portion 41, thereby reducing the influence of stress due to thermal expansion on the ridge portion 41 during rising of temperature of the chip. Consequently, a semiconductor laser device having a longer life and higher reliability can be realized.

Embodiment 3

Figure 4:
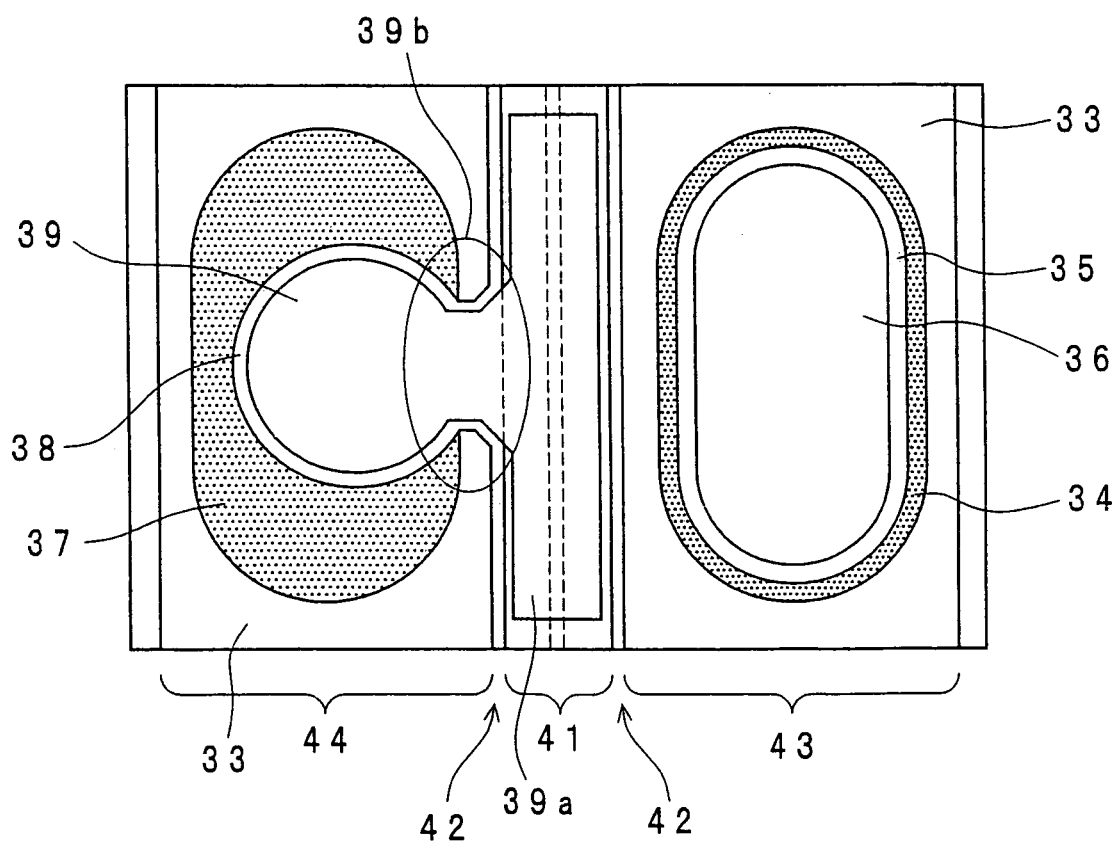
FIG. 4 is a plan view showing the third embodiment of the present invention.

FIG. 4 is a plan view showing the third embodiment of the present invention. In this embodiment, a semiconductor laser device has the same structure as shown in FIG. 2, but the underlaid film 34, the deposited electrode 35 and the plated electrode 36 on the right stage portion 43, and the underlaid film 37 on the left stage portion 44 have a shape including a curved edge line, such as circular, elliptic or oval form.

Further, each lead-out portion 39b of the deposited electrode 38 and the plated electrode 39 is shaped so that the edge line of the chip contact portion 39a intersects obliquely with the edge line of the lead-out portion 39b and includes a curved edge line.

This curved edge line can substantially eliminate a straight component perpendicular to the ridge portion 41, thereby further reducing the influence of stress due to thermal expansion on the ridge portion 41 during rising of temperature of the chip. Consequently, a semiconductor laser device having a longer life and higher reliability can be realized.

Embodiment 4

Figure 5:
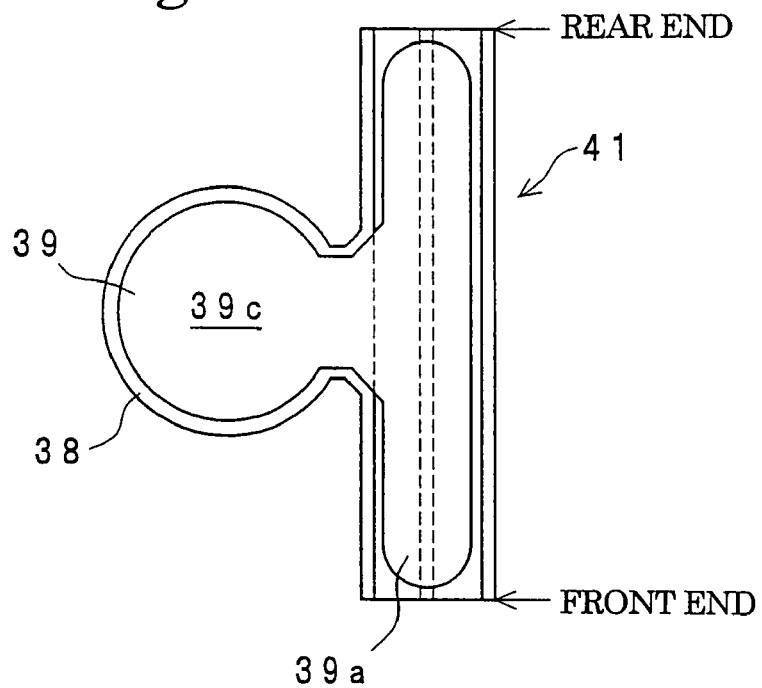
FIG. 5 is a partial plan view showing the fourth embodiment of the present invention.

FIG. 5 is a partial plan view showing the fourth embodiment of the present invention. In this embodiment, a semiconductor laser device has the same structure as shown in FIG. 2, but the edge line of the chip contact portion 39a is curved in the vicinities of both the front and rear end faces of the ridge portion 41.

As shown in FIG. 5, the chip contact portion 39a has such a planar shape, for example, that two semicircles are coupled to two straight lines parallel to the ridge portion 41. This planar shape can substantially eliminate a straight component perpendicular to the ridge portion 41, thereby further reducing the influence of stress due to thermal expansion on the ridge portion 41 during rising of temperature of the chip. Consequently, a semiconductor laser device having a longer life and higher reliability can be realized.

Figure 6:
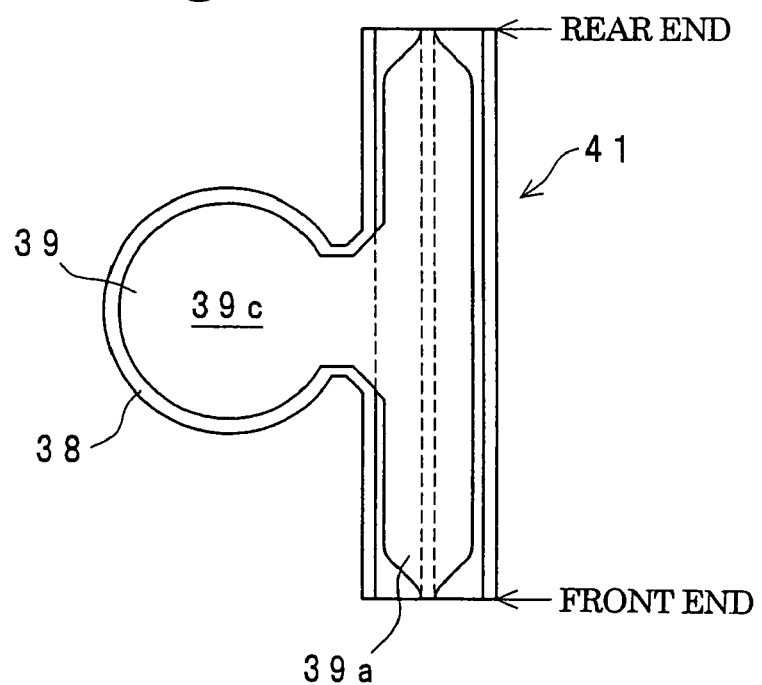
FIG. 6 is a partial plan view showing another end shape of a chip contact portion.

FIG. 6 is a partial plan view showing another end shape of the chip contact portion 39a. The plated electrode 39 reaches both the front and rear end faces of the ridge portion 41, thereby preventing a localized rise of temperature due to current concentration on the vicinity of the edge of the plated electrode as described above. Consequently, a semiconductor laser device having a longer life and higher reliability can be realized.

Embodiment 5

Figure 7:
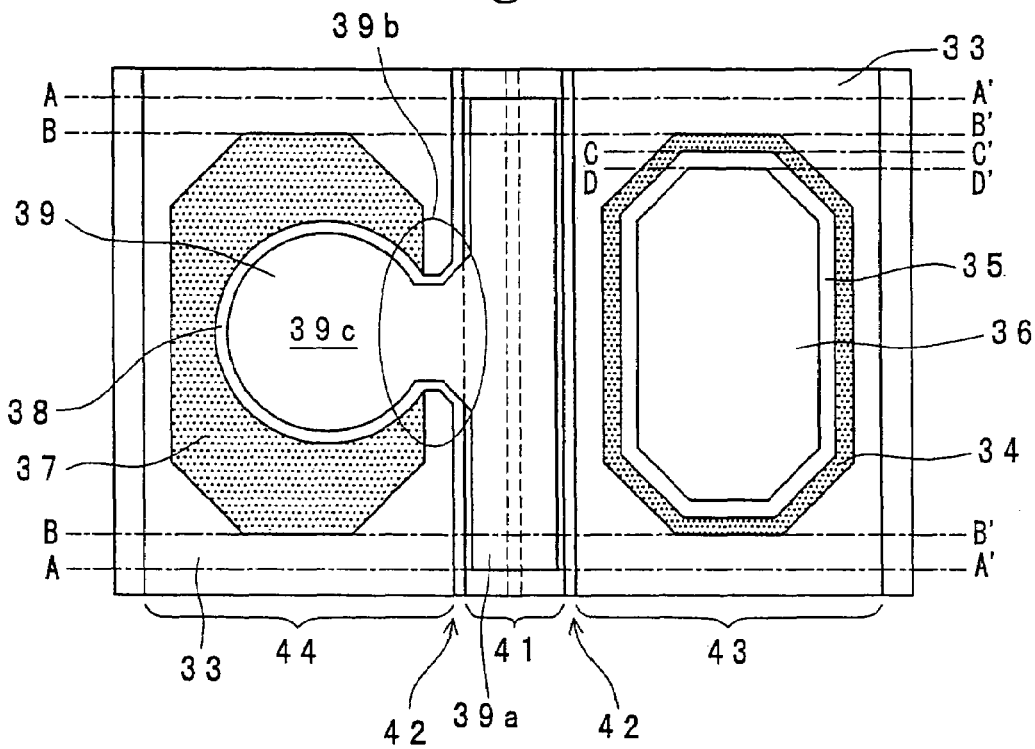
FIG. 7 is a plan view showing the fifth embodiment of the present invention.

FIG. 7 is a plan view showing the fifth embodiment of the present invention. In this embodiment, a semiconductor laser device has the same structure as shown in FIG. 2, but each of planar shapes is designed so that a line A-A' which is perpendicular to the longitudinal direction of the ridge portion 41 and in contact with the edge of the chip contact portion 39a of the plated electrode 39, a line B-B' which is perpendicular to the longitudinal direction of the ridge portion 41 and in contact with the edges of the right and left underlaid films 34 and 37, a line C-C' which is perpendicular to the longitudinal direction of the ridge portion 41 and in contact with the edge of the right deposited electrode 35, and a line D-D' which is perpendicular to the longitudinal direction of the ridge portion 41 and in contact with the edge of the right plated electrode 36, do not reside on the same straight line.

These planar shapes can disperse stress due to thermal expansion during rising of temperature of the chip to reduce the influence on the same area of the ridge portion 41. Consequently, a semiconductor laser device having a longer life and higher reliability can be realized.

Embodiment 6

Figure 8:
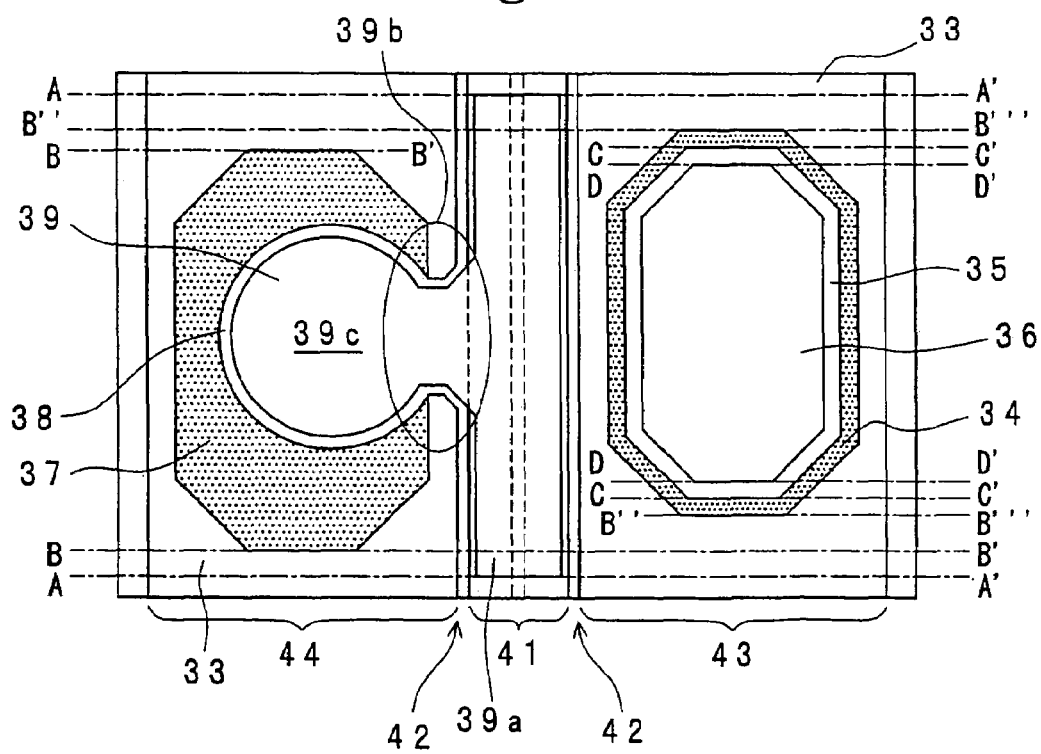
FIG. 8 is a plan view showing the sixth embodiment of the present invention.

FIG. 8 is a plan view showing the sixth embodiment of the present invention. In this embodiment, a semiconductor laser device has the same structure as shown in FIG. 2, but each of planar shapes is designed so that a line A-A' which is perpendicular to the longitudinal direction of the ridge portion 41 and in contact with the edge of the chip contact portion 39a of the plated electrode 39, a line B-B' which is perpendicular to the longitudinal direction of the ridge portion 41 and in contact with the edge of the underlaid film 37 on the left stage portion 44, a line B"-B'" which is perpendicular to the longitudinal direction of the ridge portion 41 and in contact with the edge of the underlaid film 34 on the right stage portion 43, a line C-C' which is perpendicular to the longitudinal direction of the ridge portion 41 and in contact with the edge of the right deposited electrode 35, and a line D-D' which is perpendicular to the longitudinal direction of the ridge portion 41 and in contact with the edge of the right plated electrode 36, do not reside on the same straight line.

Specifically, the planar shapes of the right and left underlaid films 34 and 37 are designed so that each straight line, in contact with each edge of the underlaid films 34 and 37, does not reside on the same straight line. These planar shapes can disperse stress due to thermal expansion during rising of temperature of the chip to reduce the influence on the same area of the ridge portion 41. Consequently, a semiconductor laser device having a longer life and higher reliability can be realized.

Embodiment 7

Figure 9:
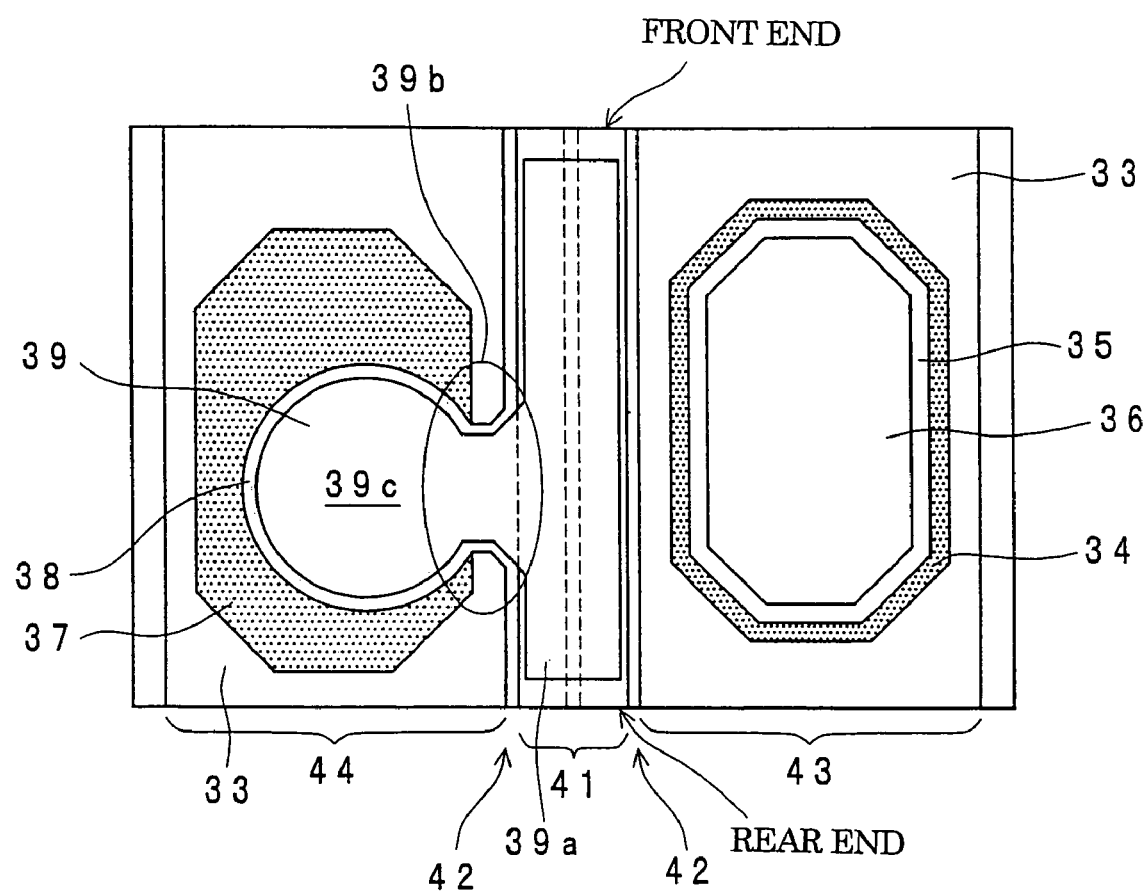
FIG. 9 is a plan view showing the seventh embodiment of the present invention.

FIG. 9 is a plan view showing the seventh embodiment of the present invention. In this embodiment, a semiconductor laser device has the same structure as shown in FIG. 2, but the bonding pad 39c of the deposited electrode 38 and the plated electrode 39 is located closer to the rear end face, having lower optical concentration, with respect to the center of the ridge portion 41.

Generally, onto the front and rear end faces applied are reflective coatings, which can constitute mirrors of an optical resonator having a lower optical reflectance at the front end face for outputting laser light, and a higher optical reflectance at the rear-end face. Therefore, higher optical concentration occurs at the front end face and lower optical concentration occurs at the rear end face inside the laser chip.

Accordingly, positioning the bonding pad 39c, which may inflict stress on the ridge portion 41, closer to the rear end face having lower optical concentration can suppress the occurrence of dark spot due to stress from the bonding pad 39c. Consequently, a semiconductor laser device having a longer life and higher reliability can be realized.

Incidentally, the above-mentioned embodiments exemplify use of a semiconductor material of AlGaInAs/InP, but the present invention can be applied to a semiconductor laser device formed of other semiconductor materials, such as AlGaInP/GaAs, etc.

Although the present invention has been fully described in connection with the preferred embodiments thereof and the accompanying drawings, it is to be noted is that various changes and modifications are apparent to those skilled in the art. Such changes and modifications are to be understood as included within the scope of the present invention as defined by the appended claims unless they depart therefrom.

What is claimed is:

1. A semiconductor laser device comprising:
a semiconductor chip including a semiconductor substrate, semiconductor cladding layers, a semiconductor active layer, and a semiconductor contact layer, laminated on the substrate, wherein part of the semiconductor substrate, the semiconductor cladding layers, the semiconductor active layer, and semiconductor contact layer constitute a semiconductor laser having front and rear end faces, transverse to the semiconductor cladding layers and the semiconductor active layer, and light generated within the semiconductor layer principally exits through the front end face;

a plurality of electrically insulating films stacked on a top external face of the semiconductor chip, wherein the electrically insulating films are farther from the semiconductor substrate than is the semiconductor contact layer, and at least one of the plurality of insulating films has, in a plan view of the top external face of the semiconductor chip, a polygonal shape with at least five apexes, each of the apexes having an interior angle larger than 90 degrees and smaller than 180 degrees; and a metal film disposed on and in contact with the electrically insulating film farthest from the top external face of the semiconductor chip, wherein
the metal film has
an area smaller than the area of the electrically insulating film farthest from the top external face of the semiconductor chip, and
a polygonal shape with apexes, each of the apexes having an interior angle larger than 90 degrees, and
the polygonal shapes of the at least one of the plurality of insulating films and the metal film have the same number of sides and apexes and are substantially coaxial.

2. A semiconductor laser device comprising:
a semiconductor laser and a metal electrode,
the semiconductor laser including:
an active layer,
a first semiconductor layer on an upper side of the active layer,
a second semiconductor layer on a lower side of the active layer,
first and second grooves that are parallel to each other, in the first semiconductor layer,
a ridge portion having a waveguide function, located between the first and second grooves,
a stage portion located at a lateral side of the first groove, and
front and rear end faces, transverse to the ridge portion and the first and second grooves, light generated within the semiconductor laser principally exiting through the front end face; and
the metal electrode including:
a laser contact portion on and in contact with a top external face of the ridge portion and including a plurality of straight edges,
a bonding pad located on and in contact with a top external face of the stage portion, the bonding pad having a dimension parallel to the first groove, and
a lead-out portion having a plurality of straight edges and including
a first part located in the first groove and in electrical contact with the laser contact portion, and
a second part located on the top external face of the stage portion and connecting the bonding pad to the first part of the lead-out portion, the second part of the lead-out portion having a width parallel to the first groove, wherein,
in a plan view of the top external face of the ridge portion, two straight edges of the second part of the lead-out portion are transverse to the first groove and adjoin and are oblique to two respective straight edges of the second part of the lead-out portion that extend toward the first groove so that the second part of the lead-out portion increases in width toward the first groove, and
the width of the second part of the lead-out portion is smaller than the dimension of the bonding pad.

* * * * *